United States Patent
Acar et al.

(10) Patent No.: US 7,671,641 B1
(45) Date of Patent: Mar. 2, 2010

(54) FREQUENCY DIVIDER

(75) Inventors: Mustafa Acar, Enschede (NL); Dominicus Martinus Wilhelmus Leenaerts, Eindhoven (NL); Bram Nauta, Enschede (NL)

(73) Assignee: ST-Ericsson SA, Geneva (CH)

( * ) Notice: Subject to any disclaimer, the term of this patent is extended or adjusted under 35 U.S.C. 154(b) by 0 days.

(21) Appl. No.: 10/591,969

(22) PCT Filed: Mar. 4, 2005

(86) PCT No.: PCT/IB2005/050818

§ 371 (c)(1),
(2), (4) Date: Sep. 7, 2006

(87) PCT Pub. No.: WO2005/091506

PCT Pub. Date: Sep. 29, 2005

(30) Foreign Application Priority Data

Mar. 11, 2004 (EP) .................................. 04100996

(51) Int. Cl.
*H03B 19/00* (2006.01)

(52) U.S. Cl. ...................... 327/117; 327/115; 327/200; 327/199; 327/202

(58) Field of Classification Search ......... 327/115–118, 327/355–360, 202, 203, 208–212, 215, 218; 377/47, 48
See application file for complete search history.

(56) References Cited

U.S. PATENT DOCUMENTS

| | | | | |
|---|---|---|---|---|
| 4,486,673 | A * | 12/1984 | Koike | 327/210 |
| 5,144,158 | A * | 9/1992 | Kanai et al. | 327/199 |
| 6,166,571 | A * | 12/2000 | Wang | 327/115 |
| 6,982,583 | B2 * | 1/2006 | Yin et al. | 327/210 |

\* cited by examiner

*Primary Examiner*—Lincoln Donovan
*Assistant Examiner*—Brandon S Cole

(57) ABSTRACT

A frequency divider includes a first latch and a second latch. The first latch is configured to receive a clock signal. The first latch is cross-coupled to the second latch. The second latch includes a circuit configured as a low-pass filter. The second latch further includes a differential pair of transistors. Each of the transistors include a drain, a source and a gate. The gates of the at least two transistors configured to receive a signal generated by the first latch. Additionally, the gates of the at least two other transistors are coupled to a control signal for determining a low-pass characteristic of the second latch.

4 Claims, 2 Drawing Sheets

FREQUENCY DIVIDER

Figure 1:
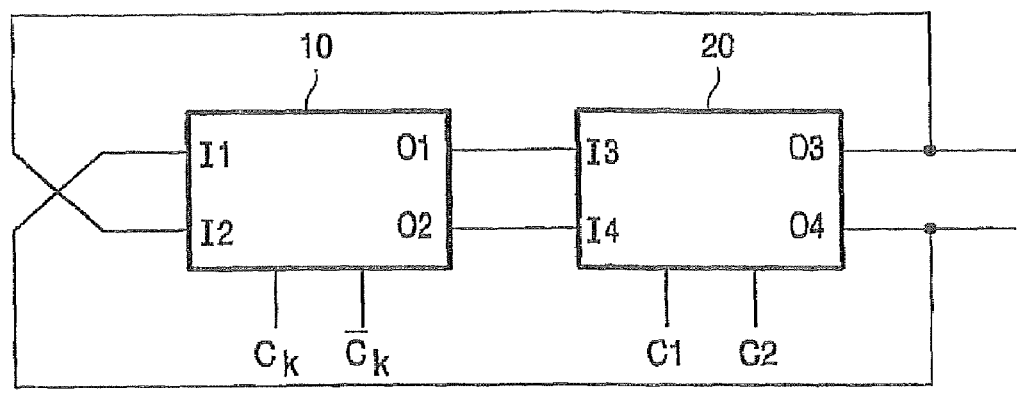

The invention relates to frequency divider.

Frequency dividers are widely used in modern communication devices for dividing a clock signal having a frequency and obtaining another signal having a lower frequency than the frequency of the clock signal. Usually, frequency dividers are implemented using flip-flops or latch circuits. Because clock signals are binary signals i.e. having a HIGH value level and a LOW level, frequency division factors, which are powers of 2 are relatively easier to be implemented.

In modern communication circuits, differential signals are often used and, as a direct consequence frequency dividers adapted to differential signals were necessary. U.S. Pat. No. 6,166,571 describes a frequency divider circuit for producing output signals of half the frequency of an input clock signal, which comprises two identical circuit sections, each producing an output signal and its complement. The circuit sections are connected to each other so that the output signals of one circuit section serve as input signals to the other circuit section. Each circuit section contains a load transistor, which is controlled by one of the clock signal and the clock signal complement, and a switch transistor, which is controlled by the other of the clock signal and the clock signal complement. The circuit exhibits a reduced RC time constant for each circuit section and an increased output signal swing between the output signals and their respective complements. It is observed that the frequency divider comprises two identical sections that are both clocked by the clock signal. The higher the frequency the more dissipated power consummated.

There is therefore a need to have a differential frequency divider, which is operable at relatively high frequencies and consummating a relatively low power.

The invention is defined in the independent claim. The dependent claims define advantageous embodiments.

Because the second latch is no longer coupled to the clock signal, the total dissipated power is reduced.

The second latch may comprise a differential pair of transistors including a first pair of transistors comprising a first transistor coupled to second transistor, and a second pair of transistor comprising third transistor coupled to a fourth transistor. Each transistor has a drain, a source and a gate. It should be pointed out here that the invention is not limited to MOS transistors implementation and in a bipolar implementation each transistor has a collector, an emitter and a base corresponding to the drains, source and gate, respectively. A drain of the first transistor and a drain of the third transistor are coupled to a source of the second transistor and to a source of the fourth transistor, respectively. Gates of the second transistor and fourth transistor receive a signal generated by the first latch. Gates of the first transistor and the third transistor are coupled to a control signal, for determining a low-pass characteristic of the second latch.

It is observed that the latch circuit behaves as a low-pass filter and amplifier. The control signals determine currents in the drains and sources of the first pair of transistors and the second pair of transistors, respectively, which, in turn, determines their amplifier and low-pass characteristics. Alternatively, if there is no need of control, the second transistor and the fourth transistor may be coupled directly to ground.

The control signal may be a DC signal, e.g. a voltage or a current, but it could be also a complementary clock signal to the clock signal supplied to the first latch.

When the control signal is a DC signal, the first latch behaves as a mixer circuit. The first latch receives an input signal having a frequency $f_{in}$ and the second latch acts as a non-linear feedback loop. The first latch combines the input signal and the signal, which is fed back by the second latch, an output frequency of a signal generated by the second latch being a sub-harmonic of the input signal. The divider can make divisions by 2, 4, 6 . . . etc. if there is a frequency multiplicative element inside the feedback loop. The non-linearity of the mixer behaves as a frequency multiplicative element and as the simulations verifies this new topology is able to make divisions by 2, 4 and 6 at the same power consumption as in the situation when the control signal is the complementary version of the clock signal applied to the first latch. It is further pointed out here that if one modifies the non-linearity of the feedback loop, divisions with factors as 3, 5, 7 are also possible. A worthwhile property of this divider is that it is able to reach higher frequencies without increasing to power consumption. This property enables the divider to reach to frequencies that is not possible by the standard D-FF based frequency dividers.

In the frequency divider, each latch comprises a negative resistance coupled between the drains of said second transistor and said fourth transistor, and between the drain of the fifth transistor and drain of the sixth transistor, respectively. The negative resistance is necessary for obtaining the latching property of the circuits and for having the necessary gain in the latches. Usually, the negative resistance is obtained using a crossed coupled pair of transistors.

Figure 2A:
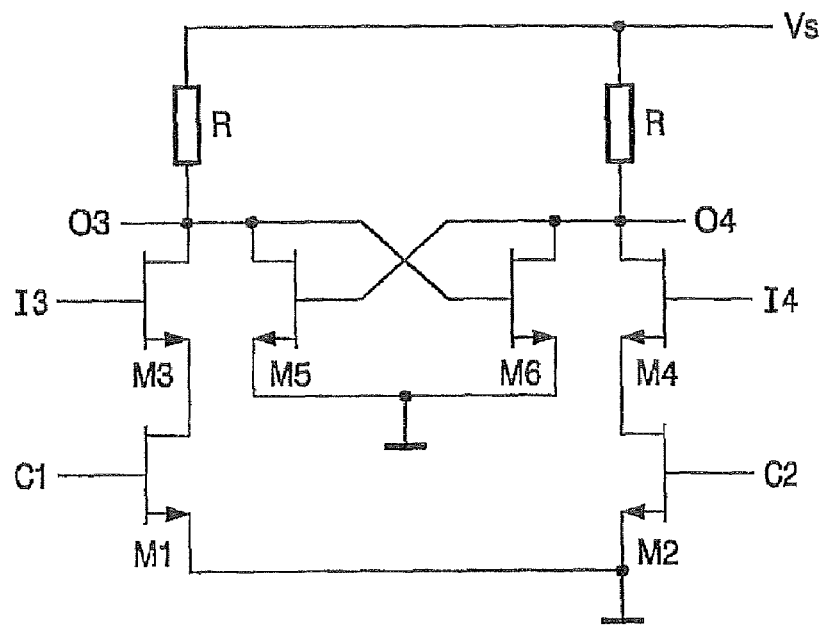
Figure 2B:
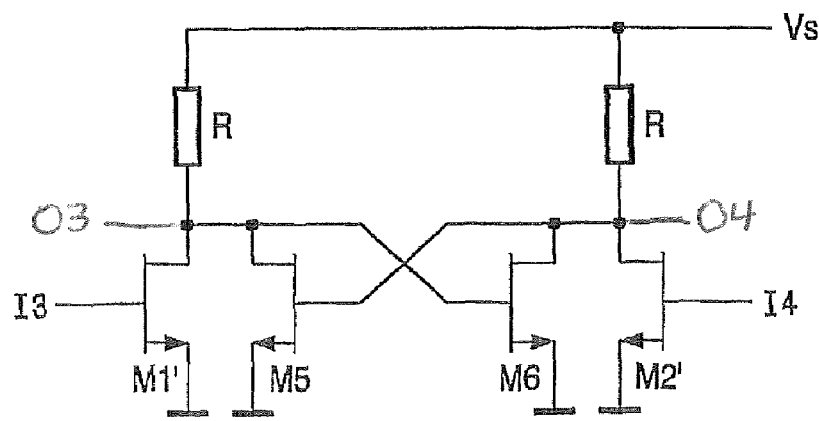
Figure 3A:
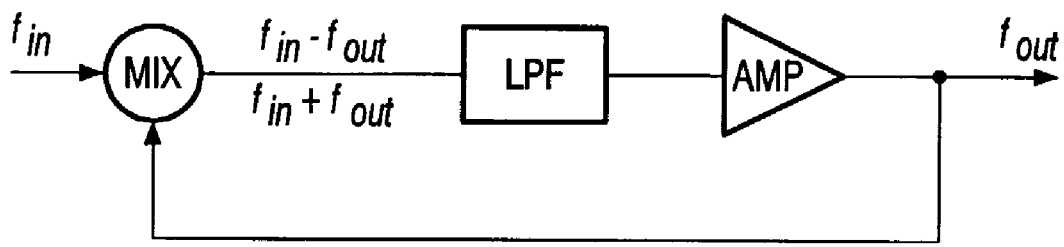
Figure 3B:
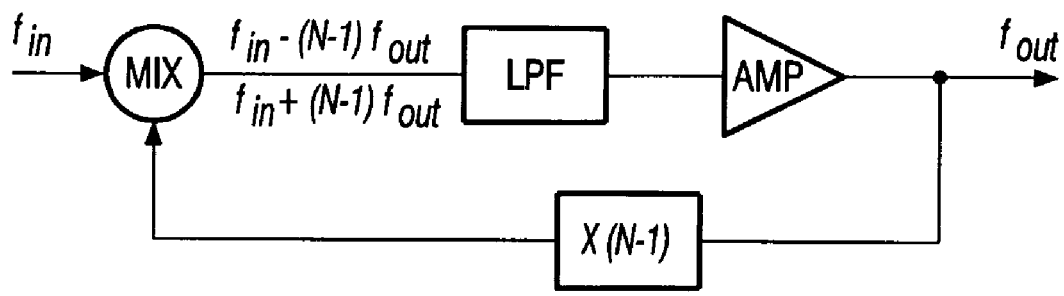

The above and other features and advantages of the invention will be apparent from the following description of the exemplary embodiments of the invention with reference to the accompanying drawings, in which:

FIG. 1 depicts a block schematic of a frequency divider, according to the invention, FIG. 2a depicts an embodiment of a second latch circuit according to the invention, FIG. 2b, depicts another embodiment of a second latch circuit according to the invention, and FIGS. 3a and 3b depict the principle of operation of the invention.

FIG. 1 depicts a block schematic of a frequency divider according to the invention. The divider comprises a first latch 10 and a second latch 20, the second latch 20 being crossed-coupled to the first latch. The first latch 10 comprises a clock input for receiving a clock signal, and the second latch 20 comprises a latch circuit configured as a low-pass filter. The first latch 10 comprises a first input I1 and a first complementary input I2 and a first output O1 and a first complementary output O2.

The second latch 20 comprises a second input I3 and a second complementary input I4 and a second output O3 and a second complementary out put O4. The outputs of the first latch 10 are coupled to the corresponding inputs of the second latch 20 i.e. O1 to I3 and O2 to I4. The outputs of the second latch 20 are coupled to the complementary inputs of the first latch 10 i.e. O3 to I2 and O4 to I1 i.e. the first latch 10 and the second latch are crossed-coupled. The first latch 10 receives a differential clock signal Ck, $\overline{Ck}$, and a pair of control signals C1 and C2 controls the second latch 20. At the second output O3 and at the second complementary output O4 there is obtained a signal having a frequency, which is fraction of a frequency of the clock signal.

Preferably, the second latch 20, as shown in FIG. 2a, comprises a differential pair of transistors M1, M3; M2, M4 including a first pair of transistors comprising a first transistor M1 coupled to second transistor M3. The second pair of transistor comprises third transistor M2 coupled to a fourth transistor M4, each transistor having a drain, a source and a gate. It should be pointed out here that the invention is not limited to MOS transistors implementation and in a bipolar implementation each transistor has a collector, an emitter and a base corresponding to the drains, source and gate, respectively. A drain of the first transistor M1 and a drain of the third transistor M2 are coupled to a source of the second transistor M3 and to a source of the fourth transistor M4, respectively. Gates of the second transistor M3 and fourth transistor M4 receiving a signal generated by the first latch 10. Gates of the first transistor M1 and the third transistor M2 are coupled to a control signal C1, C2, for determining a low-pass characteristic of the second latch. In FIG. 2a, items having the same significance as in FIG. 1 are denoted by the same markings i.e. letters and figures.

It is observed that the latch circuit behaves as a low-pass filter and amplifier. The control signals C1 and C2 determine currents in the drains and sources of the first pair of transistors M1, M3 and the second pair of transistors M2, M4, respectively, which, in turn, determines their amplifier and low-pass characteristics. Alternatively, if there is no need of control, the second transistor and the fourth transistor may be coupled directly to ground as shown in FIG. 2b. In FIG. 2b, the second latch 20 comprises, a differential pair of transistors M1', M2' including a fifth transistor M1' and a sixth transistor M2'. A drain of the fifth transistor M1' and the drain of the sixth transistor M2' are coupled to supply voltage Vs via respective resistors R. A source of the fifth transistor M1' and a source of the sixth transistor M2' is coupled to a common potential e.g. ground. Gates of the fifth transistor M1' and sixth transistor M2' receive a signal generated by the first latch 10. In FIG. 2b, items having the same significance as is FIG. 2b are denoted by the same markings i.e. letters and figures. The control signals C1, C2 may be a DC signal, e.g. a voltage or a current.

Furthermore, C1 and C2 may be substantially equal to each other. The control signals may be a complementary clock signal to the clock signal supplied to the first latch.

When the control signal is a DC signal, the first latch behaves as a mixer circuit. The first latch 10 receives an input signal having a frequency $f_{in}$ and the second latch acts as a non-linear feedback loop. The first latch 10 combines the input signal and the signal, which is fed back by the second latch 20, an output frequency of a signal generated by the second latch 20 being a sub-harmonic of the input signal. The divider can make divisions by 2, 4, 6 . . . etc. if there is a frequency multiplicative element inside the feedback loop. It is further pointed out here that if one modifies the non-linearity of the feedback loop, divisions with factors as 3, 5, 7 are also possible.

The behavior of the frequency divider may be easier explained using the schematics shown in FIGS. 3a and 3b. As seen in FIG. 3a the output signal $f_{out}$ is fed back to the input of the mixer MIX. A low pass-filter filters out the higher frequency product coming from the mixer. If there is enough gain in the loop and the total phase shift is multiple of $2\pi$ than the following equality will be satisfied $$f_{in} - f_{out} = f_{out} \rightarrow f_{in} = 2f_{out} \quad (1)$$

If there is a frequency-multiplying element in the loop than it is even possible to make frequency divisions higher than two, $$f_{in} - (N-1)f_{out} = f_{out} \rightarrow f_{in} = Nf_{out} \quad (2)$$

The maximum input frequency of this division concept generally determined by the loop cut off frequency $f_{max}$, which is limited by both the mixer and the amplifier. Theoretically it is possible to make frequency divisions between the input frequencies $2f_{max}/3$ and $2f_{max}$. At input frequencies lower than $2f_{max}/3$ the product $f_{in} * f_{out}$ falls into the pass band of the low-pass filter. Therefore regenerative frequency divider has theoretically a minimum operating frequency. It may be shown that one of the factors determining the theoretical bandwidth ($2f_{max}/3 - 2f_{max}$) is the order of the low-pass filter. Frequency division cannot be achieved if the low-pass filter is chosen as a first order filter. For third order or higher order filters the theoretically maximum possible bandwidth ($2f_{max}/3 - 2f_{max}$) assumption becomes acceptable. When there is no input signal no output signal is obtained. The output signal is generated only when there is an input signal. The non-linearity of the mixer behaves as a frequency multiplicative element and as the simulations verifies this new topology is able to make divisions by 2, 4 and 6 at the same power consumption as in the situation when the control signal is the complementary version of the clock signal applied to the first latch. Without increasing the power consumption being able to reach to higher frequencies is a worth mentioning property of this divider. This property enables the divider to reach to frequencies that is not possible by the standard D-FF based frequency dividers.

In the frequency divider, each latch comprises a negative resistance coupled between the drains of said second transistor and said fourth transistor, and between the drain of the fifth transistor and drain of the sixth transistor, respectively. The negative resistance is necessary for obtaining the latching property of the circuits and for having the necessary gain in the latches. Usually, the negative resistance is obtained using a crossed coupled pair of transistors, which are described as transistors pair M5, M6 in FIGS. 2a and 2b.

It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed purpose processor. The invention resides in each new feature or combination of features.

The invention claimed is:
1. A frequency divider comprising,
a first latch comprising a clock input for receiving a clock signal;
a second latch comprising a latch circuit configured as a low-pass filter, the second latch being cross-coupled to the first latch; and
wherein the second latch comprises
a differential pair of transistors including
a first pair of transistors comprising a first transistor coupled to a second transistor
a second pair of transistors comprising a third transistor coupled to a fourth transistor
each transistor having a drain, a source and a gate,
the drain of the first transistor and the drain of the third transistor being coupled to the source of the second transistor and to the source of the fourth transistor respectively,
the gates of the second transistor and the fourth transistor receiving a signal generated by the first latch,
the gates of the first transistor and the third transistor being coupled to a control signal for determining a low-pass characteristic of the second latch, and
wherein the control signal is a DC signal.
2. A frequency divider as claimed in claim 1, wherein each latch comprises a negative resistance coupled between the drains of said second transistor and said fourth transistor and wherein the negative resistance comprises a fifth transistor and a sixth transistor.

3. A frequency divider as claimed in claim 1, wherein the second latch comprises a differential pair of transistors including
- a fifth transistor and a sixth transistor
- each transistor having a drain, a source and a gate,
  - the drain of the fifth transistor and the drain of the sixth transistor being coupled to supply voltage via respective resistors,
  - the source of the fifth transistor and the source of the sixth transistor being coupled to a common potential,
  - the gates of the fifth transistor and the sixth transistor receiving a signal generated by the second latch.

4. A frequency divider comprising,
- a first latch comprising a clock input for receiving a clock signal;
- a second latch comprising a latch circuit configured as a low-pass filter, the second latch being crossed-coupled to the first latch; and
- wherein the second latch comprises
- a differential pair of transistors including
  - a first transistor and a second transistor,
  - each transistor having a drain, a source and a gate,
    - the drain of the first transistor and the drain of the second transistor being coupled to supply voltage (Vs) via respective resistors,
    - source of the first transistor and the source of the second transistor being coupled to a common potential,
    - the gates of the first transistor and the second transistor receiving a signal generated by the second latch,
    - the second latch controlled by first and second control signals, and
  - wherein the control signals are DC signals.

* * * * *